United States Patent [19]

Nishimura et al.

[11] 4,216,451
[45] Aug. 5, 1980

[54] VARIABLE CAPACITANCE DEVICE HAVING A PLURALITY OF CAPACITANCE ELEMENTS AND A PLURALITY OF SWITCHING ELEMENTS THEREFOR FORMED ON A SINGLE COMMON SUBSTRATE

[75] Inventors: Itsuro Nishimura, Takatsuki; Tsutomu Ohgishi, Yahata, both of Japan

[73] Assignee: Sanyo Electric Co., Ltd., Osaka, Japan

[21] Appl. No.: 885,281

[22] Filed: Mar. 10, 1978

[30] Foreign Application Priority Data

Mar. 10, 1977 [JP] Japan .................................. 52-27827

[51] Int. Cl.$^2$ ............................ H03J 5/24; H03J 3/18
[52] U.S. Cl. ..................................... 334/15; 307/303; 307/304; 334/55; 357/51
[58] Field of Search ..................... 307/304; 357/23, 51; 334/15, 55

[56] References Cited

U.S. PATENT DOCUMENTS

| | | | |
|---|---|---|---|
| 3,427,514 | 2/1969 | Olmstead et al. | 357/23 |
| 3,657,560 | 4/1972 | Proebsting | 307/304 |
| 3,808,472 | 4/1974 | Engeler | 334/15 |
| 4,141,027 | 2/1979 | Baldwin et al. | 357/23 X |

FOREIGN PATENT DOCUMENTS

| | | |
|---|---|---|
| 2006333 | 8/1971 | Fed. Rep. of Germany . |
| 2145386 | 3/1972 | Fed. Rep. of Germany . |
| 1566228 | 9/1969 | France . |

OTHER PUBLICATIONS

Eaton, S. S. "Sapphire Brings Out the Best in C–Mos", Electronics, Jun. 1975, pp. 115–118.
Benz, H. F. et al, "A Linear Voltage-Tunable Distributed Null Device", IEEE Journal of Solid-State Circuits, Dec. 1972, pp. 499–503.

Primary Examiner—Paul L. Gensler
Attorney, Agent, or Firm—Armstrong, Nikaido, Marmelstein & Kubovcik

[57] ABSTRACT

A variable capacitance semiconductor device is provided wherein a plurality of capacitance elements each having a fixed capacitance value are coupled in parallel with each other and at least two insulated gate field effect transistors are provided for each of the plurality of capacitance elements, whereby the total length of the insulated gate field effect transistors is made as long as possible and accordingly the resistance across the transistors when these are turned on becomes small. Each capacitance element may comprise a single semiconductor substrate of one conductivity type, an opposite conductivity type region formed on one surface of the substrate, an insulating layer formed on the opposite conductivity type region and an electrode formed on the insulating layer. The above described at least two insulated gate field effect transistors are formed such that the above described substrate is shared. Preferably, a direct current voltage is applied to the opposite conductivity type region in the direction for decreasing the junction capacitance between the opposite conductivity type region and the substrate occuring when the above described transistors are turned off.

35 Claims, 13 Drawing Figures

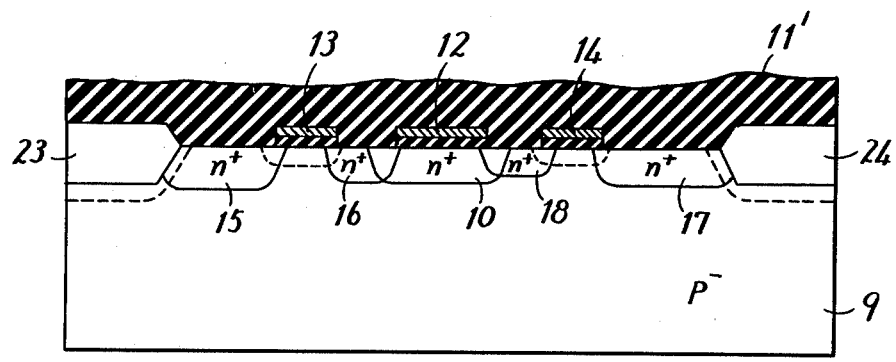
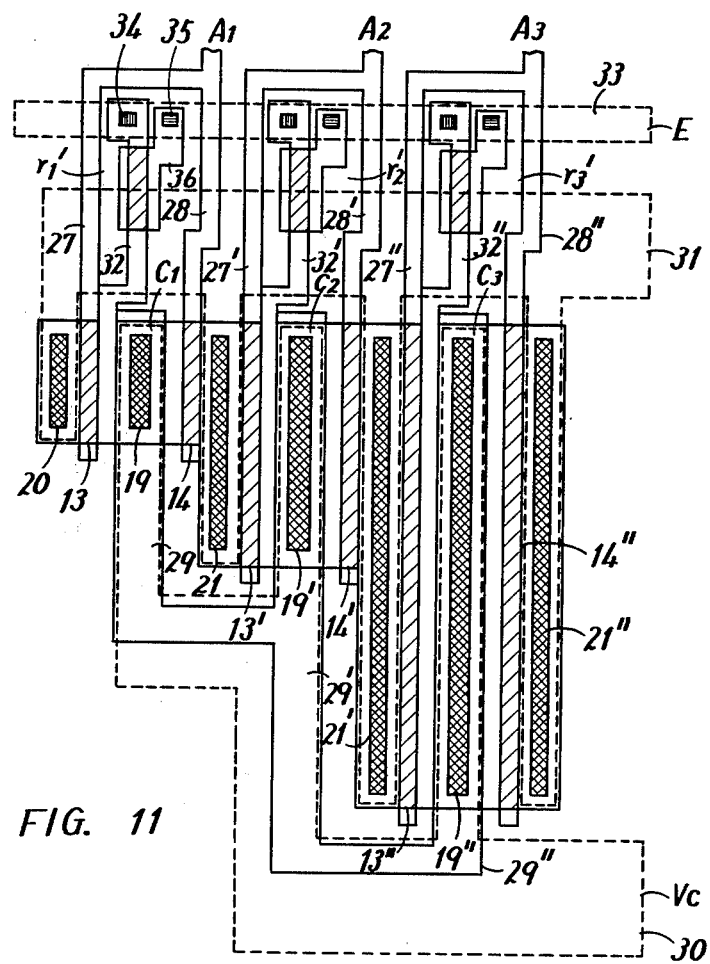

VARIABLE CAPACITANCE DEVICE HAVING A PLURALITY OF CAPACITANCE ELEMENTS AND A PLURALITY OF SWITCHING ELEMENTS THEREFOR FORMED ON A SINGLE COMMON SUBSTRATE

BACKGROUND OF THE INVENTION:

1. Field of the Invention;

The present invention relates to a variable capacitance device. More specifically, the present invention relates to a variable capacitance device particularly suited for use in a digital channel selecting apparatus, wherein a plurality of capacitance elements are coupled in parallel, each constituting a portion of a tuning circuit, such that each capacitance element is individually coupled to a corresponding switching device which is operable responsive to a digital control signal, whereby the total capacitance value associated with the tuning circuit is varied to achieve channel selection.

2. Description of the Prior Art;

As well known, a channel selecting apparatus or a tuning apparatus comprises at least one tuning circuit including inductance and capacitance components. For the purpose of channel selection in such a channel selecting apparatus, either or both of the inductance and capacitance must be varied to attain a different tuning frequency by the tuning circuit. Most typically, the capacitance component is structured to be variable while the inductance component is fixed. Such a capacitance component structured to be variable, or a variable capacitance device, is required in various applications, such as an LC or RC oscillator, for example, wherein a desired frequency is attained through selective variation of the capacitance value of such a variable capacitance device.

A typical scheme so far adopted for varying the capacitance value of such a variable capacitance device is to vary a reverse bias voltage to be applied to a voltage controlled variable capacitance diode coupled in the device, thereby to vary the capacitance across the diode.

Recently, a variable capacitance device comprising a plurality of series connections coupled in parallel with each other each including a capacitance element and a switching diode was developed. In using such a variable capacitance device, the same is connected such that the total capacitance is varied by selectively applying a digital control signal to each of the switching diodes, thereby to selectively render effective a desired capacitance element or elements.

The above described voltage controlled variable capacitance diode and the above described variable capacitance device comprising a plurality of series connections coupled in parallel with each other each including a capacitance element and a switching diode are particularly suited for the tuning apparatus or a channel selecting apparatus. FIG. 1 shows a block diagram of one example of a typical prior art tuner. In particular, FIG. 1 is a block diagram showing an outline of a tuner or a channel selecting apparatus for use in a typical television receiver. As is well known, the tuner 1 comprises an input tuning circuit 2, an inter-stage tuning circuit 3, a local oscillator 4 and a mixer 5 for mixing the high frequency signal from the inter-stage tuning circuit 3 with the local oscillation signal from the local oscillator 4 to provide an intermediate frequency signal through superheterodyne detection.

In a channel selecting operation by means of the tuner 1, the input tuning circuit 2, the inter-stage tuning circuit 3 and the tuning circuit included in the local oscillator 4 must be adjusted to a desired tuning frequency determinable depending on the channel to be selected.

FIG. 2 shows a schematic diagram of such a tuning circuit that could be implemented using the above described variable capacitance device comprising a plurality of series connections coupled in parallel with each other each including a capacitance element and a switching diode. It is needless to say that such a tuning circuit as shown in FIG. 2 may be employed as the input tuning circuit 2, the inter-stage tuning circuit 3, and the tuning circuit included in the local oscillator 4 shown in FIG. 1, for example.

FIG. 2 shows an example of a tuning circuit that constitutes the background of the invention and can be theoretically utilized in a very high frequency or VHF application. Thus, the VHF tuning circuit shown comprises series connected coupling capacitors CC1 and CC2, an inductance coil L coupled in parallel between these coupling capacitors CC1 and CC2 and the above described variable capacitance device C coupled in parallel between these capacitors CC1 and CC2. The variable capacitance device C comprises a plurality of capacitance elements C1, C2, C3, ... Cn, and a corresponding plurality of switching diodes D1, D2, D3, ... Dn, each connected in series with the corresponding one of the above described capacitance elements C1, C2, C3, ... Cn, respectively, thereby to constitute a corresponding plurality of series connections in parallel with each other, each including a capacitance element and a switching diode. The junctions of the respective series connections are coupled through corresponding resistors R1, R2, R3, ... Rn to output terminals t1, t2, t3, ... tn respectively, of a digital signal generator 7. The switching diodes D1, D2, D3, ... Dn are each responsive to a corresponding individual digital control signal from the digital signal generator 7 to be rendered conductive, whereby the capacitance element coupled to the switching diode now rendered conductive is rendered effective or selected as a capacitance to constitute a portion of the tuning circuit as desired. For the purpose of facility of understanding, assuming that only the switching diodes D1 and D2 are selected as a function of the control signals from the digital signal generator 7, the total capacitance of the variable capacitance device C can be simply calculated as (C1+C2). Thus, the total capacitance of the variable capacitance device C can be varied in a digital manner or a stepwise manner as a function of the digital control signal.

Meanwhile, in order to enable selection of many channels using the above described tuning circuit, a correspondingly increased number of capacitance elements are required in such a variable capacitance device. In view of an increased number of capacitance elements in a variable capacitance device, it is desired that such a variable capacitance device is implemented in an integrated circuit. Nevertheless, it is rather difficult to attain a uniform characteristic throughout the wide range of capacitance values by such a variable capacitance device as implemented in an integrated circuit. Some other problems are encountered in such an integrated circuit variable capacitance device. For these reasons, it is not so easy to implement such a variable capacitance device implemented in an integrated circuit.

SUMMARY OF THE INVENTION

Briefly described, the present invention is directed to a structure of a variable capacitance semiconductor device wherein a plurality of capacitance elements each having a fixed capacitance value are coupled in parallel with each other and a corresponding plurality of switching devices are operatively coupled to the respective capacitance elements for selectively rendering effective a desired capacitance element. Each of the capacitance elements may comprise a single common semiconductor substrate, a conductive region formed on one surface of the substrate, an insulating layer provided on the above described conductive region, and an electrode formed on the conductive region with the above described insulating layer therebetween.

The switching devices each may be an insulated gate field effect transistor. According to one feature of the present invention, at least two insulated gate field effect transistors are provided associated with at least one capacitance element, such that the substrate is shared. The conductive region constituting the capacitance element and the drain region of the insulated gate field effect transistor are commonly connected to each other. The gate electrodes of the above described at least two transistors formed an associated with at least one capacitance element and are coupled to each other, whereby the above described at least two transistors may be used as a switching device of the above described at least one capacitance element. As a result, the total length of the insulated gate field effect transistors serving as a switching device can be selected to be as large as possible and the resistance of the transistor when the same is turned on becomes small, with the result that the inventive variable capacitance semiconductor device can be used throughout a wide frequency range.

In a preferred embodiment, the inventive variable capacitance semiconductor device may be a diffusion type structure, but alternatively may be a silicon on sapphire structure.

In another preferred embodiment of the present invention, a direct current voltage is applied to the conductive regions in the direction for decreasing a junction capacitance occurring between each of the conductive region and the substrate when the corresponding transistor is turned off.

According to a further preferred embodiment of the present invention, the inventive variable capacitance device comprises a first comb type metallic layer serving as a first terminal of the device for coupling in parallel the respective electrodes of the plurality of capacitance elements, and a second comb shaped metallic layer serving as a second terminal of the variable capacitance device arranged so as to be interdigitated with the first comb shaped metallic layer and coupled to the source region of each of the insulated gate field effect transistors.

According to one aspect of the present invention, a channel selecting apparatus of an integrated circuit structure is provided wherein a plurality of capacitance elements each having a fixed capacitance value are coupled in parallel with each other, such that any of the capacitance elements may be selectively rendered effective responsive to a digital control signal for achieving a different combination of any selected capacitance elements coupled in parallel with each other and thus achieving a variable capacitance device the total capacitance value of which is variable responsive to a digital control signal. Since a number of such capacitance elements can be provided each having a fixed capacitance value, precision of channel selection can be enhanced.

Accordingly, a principal object of the present invention is to provide an improvement in a variable capacitance device the capacitance value of which is variable responsive to a digital control signal.

Another object of the present invention is to provide a variable capacitance semiconductor device comprising a plurality of capacitance elements coupled in parallel with each other each having a fixed capacitance value, and a corresponding plurality of switching devices operatively coupled to said plurality of capacitance elements so as to selectively render effective the respective capacitance elements, said plurality of switching devices being coupled to be responsive to a digital control signal.

A further object of the present invention is to provide a variable capacitance semiconductor device, comprising a plurality of capacitance elements coupled in parallel with each other having a fixed capacitance value, a corresponding plurality of switching devices operatively coupled to said plurality of capacitance elements so as to selectively render effective the respective capacitance elements, said plurality of switching devices being coupled to be responsive to a digital control signal, wherein said capacitance elements and said switching devices are formed on a single substrate and said switching devices are implemented in the form of an insulated gate field effect transistor, such that an on resistance thereof may be small when the transistor is turned on.

Still another object of the present invention is to provide a variable capacitance semiconductor device comprising a plurality of capacitance elements coupled in parallel with each other, and a corresponding plurality of switching devices operatively coupled to said plurality of capacitance elements so as to selectively render effective the respective capacitance elements, said plurality of switching devices being coupled to be responsive to a digital control signal, wherein said plurality of switching devices are implemented in the form of an insulated gate field effect transistor such that any parasitic capacitance occurring when the transistor is turned off is adapted to be minimized.

It is another object of the present invention to provide a variable capacitance semiconductor device comprising a plurality of capacitance elements coupled in parallel with each other and a corresponding plurality of switching devices operatively coupled to said plurality of switching elements so as to selectively render effective any of said plurality of switching elements, said plurality of switching devices being coupled to be responsive to a digital control signal for achieving a different combination of any selected capacitance elements coupled in parallel with each other, wherein said plurality of switching devices are implemented in the form of an insulated gate field effect transistor, the respective electrodes of said plurality of capacitance elements are coupled in parallel with each other by means of a first comb shaped metallic layer, and the source regions of the insulated gate field effect transistors constituting said plurality of switching devices are coupled by means of a second comb shaped metallic layer arranged to be interdigitated with said first comb shaped metallic layer.

It is a further object of the present invention to provide a digital channel selecting apparatus comprising a variable capacitance semiconductor device including a plurality of capacitance elements coupled in parallel with each other and a plurality of switching devices operable responsive to a digital control signal each individually coupled to said plurality of capacitance elements, wherein said plurality of capacitance elements and said plurality of switching devices are formed on a single semiconductor substrate in an integrated circuit structure.

These objects and other objects, features, aspects and advantages of the present invention will become more apparent from the following detailed description of the present invention when taken in conjunction with the accompanying drawings.

BRIEF DESCRIPTION OF THE DRAWINGS:

FIGS. 7 through 10 each show a sectional view of a semiconductor device at several stages of the process for manufacturing the FIG. 6 integrated circuit;

FIG. 11 shows a plan view of the pattern of the inventive integrated circuit variable capacitance device including three capacitance elements for implementing a selecting apparatus;

Figure 1:
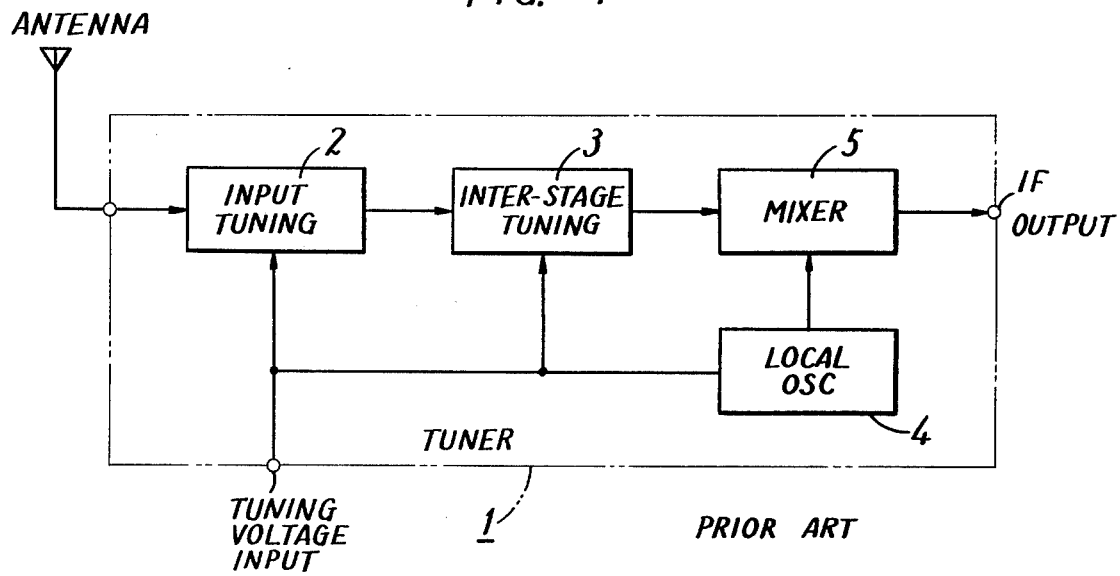
FIG. 1 is a block diagram showing an outline of a tuner or a channel selecting apparatus for use in a typical television receiver.
Figure 2:
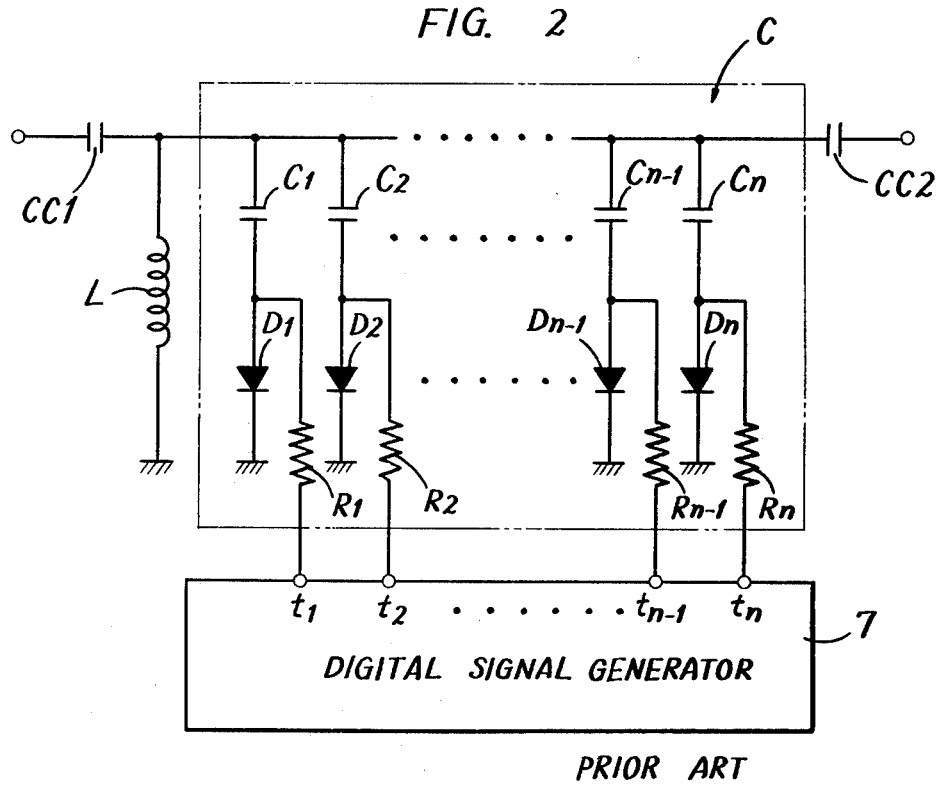
FIG. 2 is an example of a tuning circuit that constitutes the background of the invention and can be theoretically utilized in a VHF application.
Figure 3:
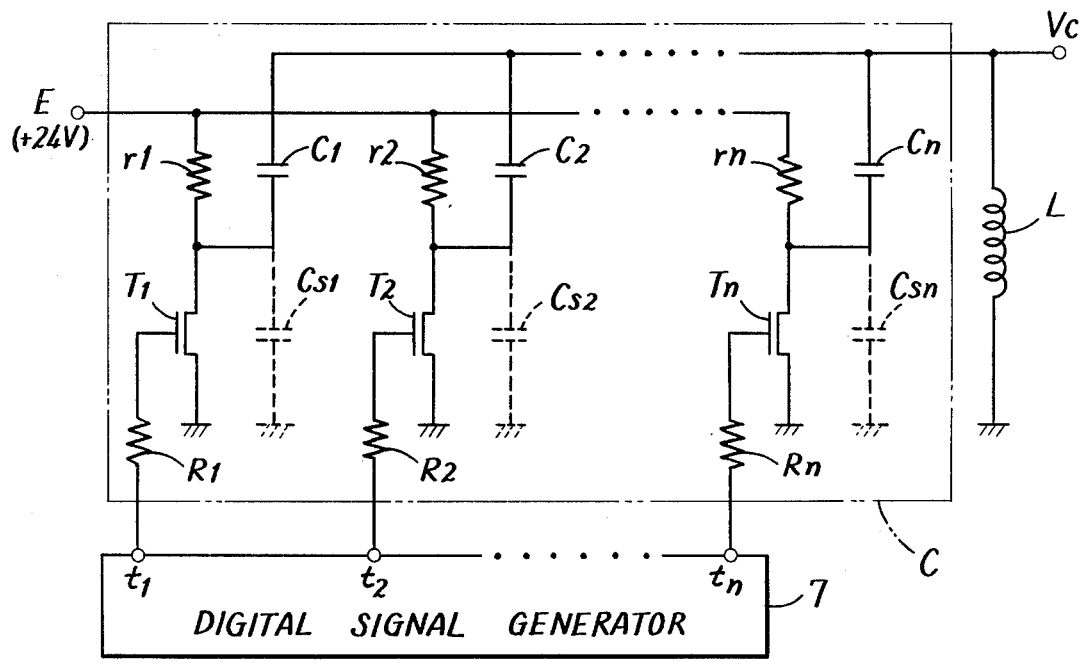
FIG. 3 is a schematic diagram showing the principle of the inventive variable capacitance device, wherein the FIG. 2 variable capacitance device has been implemented in an integrated circuit.

DESCRIPTION OF THE PREFERRED EMBODIMENTS:

FIG. 3 is a diagram showing the principle of the inventive variable capacitance device, wherein the FIG. 2 variable capacitance device has been implemented in an integrated circuit. In the FIG. 3 diagram, the switching diodes D1, D2, D3, ... Dn in the FIG. 2 variable capacitance device have been replaced by insulated gate field effect transistors T1, T2, T3, ... Tn. More specifically, one electrode of each of the capacitors C1, C2, C3, ... Cn is connected to the drain electrode of the corresponding one of the insulated gate field effect transistors T1, T2, T3, ... Tn, while the source electrode of each of the transistors T1, T2, T3, . . . Tn is grounded. The gate electrodes of the respective transistors T1, T2, T3, ... Tn are connected through the respective resistors R1, R2, R3, ... Rn to the digital signal generator 7, the said resistors R1, R2, R3, ... Rn corresponding to the resistors R1, R2, R3, ... Rn coupled to the respective anode electrodes of the diodes D1, D2, D3, ... Dn in the FIG. 2 variable capacitance device. The respective drain electrodes of the said transistors T1, T2, T3, ... Tn are connected through the corresponding resistors r1, r2, r3, ... rn, respectively, to a direct current voltage source, of say +24 V.

It is pointed out that the circuit shown comprises undesired parasitic capacitances Cs1, Cs2, Cs3, ... Csn, in conjunction with the above described capacitors C1, C2, C3, ... Cn, respectively, as to be more fully described subsequently.

Figure 4:
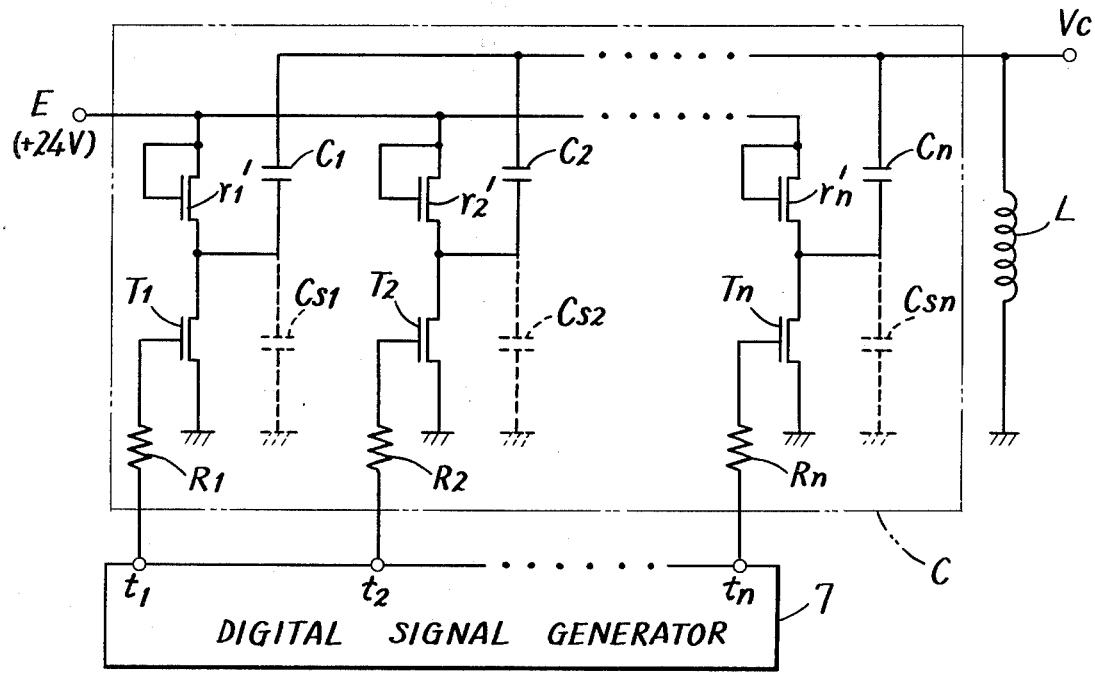
FIG. 4 is similar to FIG. 3 but shows the inventive variable capacitance device embodied based on the different principle in an integrated circuit.

FIG. 4 is a schematic diagram showing another principle of the inventive variable capacitance device, wherein the resistors r1, r2, r3, ... rn in the FIG. 3 variable capacitance device have been replaced by insulated gate field effect transistors r1', r2', r3', ... rn', the remaining portions being the same as those in the FIG. 3 variable capacitance device. It is pointed out that the present invention is directed to a preferred semiconductor structure for implementing the FIG. 4 variable capacitance device.

It is seen that FIGS. 3 and 4 variable capacitance devices, each comprise a plurality (n) of series connections coupled in parallel with each other, each including a capacitance element and an insulated gate field effect transistor. Therefore, in the following, description will be made of the inventive variable capacitance device, centering on only the first capacitance element C1, while the remaining capacitance elements are not described, unless it becomes necessary.

Figure 5:
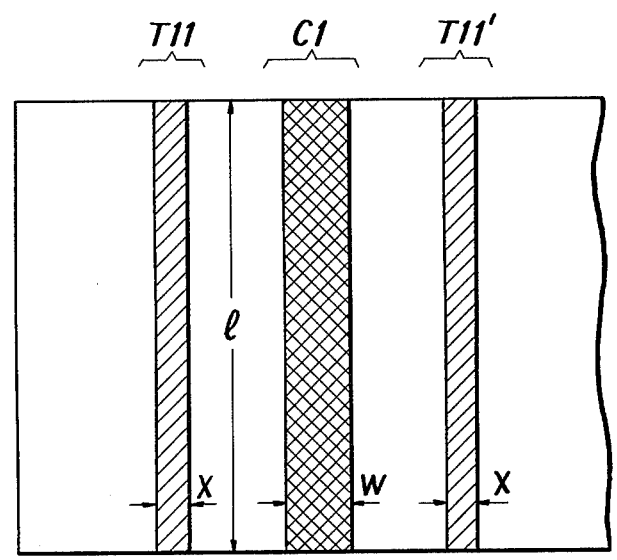
FIG. 5 is a plan view of a semiconductor device implementing the inventive variable capacitance device.

According to the present invention, parallel connection of the above described plurality of series connections is implemented in an integrated circuit. In order that the series connection of say the capacitance element C1 and the transistor T1 can be utilized in a broad frequency range of 200 MHz through 1 GHz, for example, the product C·Ron of the resistance value Ron of the transistor T1 when the same is conductive and the capacitance value C of the capacitance element C1 must satisfy the relation C·Ron $\ll 1/2\pi f$. It is pointed out that the present invention is directed to an improvement in an integrated circuit structure for minimizing the value Ron. In general, the resistance value Ron may be expressed by the following equation.

$$Ron = 1/\epsilon\epsilon_0\mu/d \cdot l/x \cdot (Vg - Vt)$$

where $\epsilon_0$ is a dielectric constant of an insulation between the gate and channel, $\epsilon$ is a dielectric constant in a vacuum, $\mu$ is the conductivity, d is a thickness of the insulation between the gate and channel, i.e. a thickness of the gate insulator, l and X are the length and the width of the transistor on the semiconductor device implementing the above described integrated circuit, as shown in FIG. 5. In the above described equation, theoretically several factors can be considered for reducing the resistance value Ron. As a result of study by the present inventors, however, it has been observed that the best factor to be actually treated is the length l while the other factors are not proper. For example, reduction of the thickness d could result in damage of the gate insulator and reduction of the width X of the transistor decreases the withstand voltage between the source and drain electrodes and is directly opposite to another requirement to be described subsequently that a parasitic capacitance Cs1 when the transistor T1 is turned off must be reduced. For these reasons, reduction of the thickness of the gate insulator and the width of the transistor is not preferred. Therefore, as a result of any effort to find an expedient for increasing the length l of the transistor, an improved arrangement of the transistor was provided wherein a pair of transistors are formed at opposite sides of the capacitance element C1 in an integrated circuit structure to achieve at least a doubled length l. Thus, the inventive variable capacitance device comprises a capacitance element C1 and a switching transistor T1 formed such that two switching transistors T11 and T11' are arranged extending at both sides of the single capacitance element C1.

Figure 6:
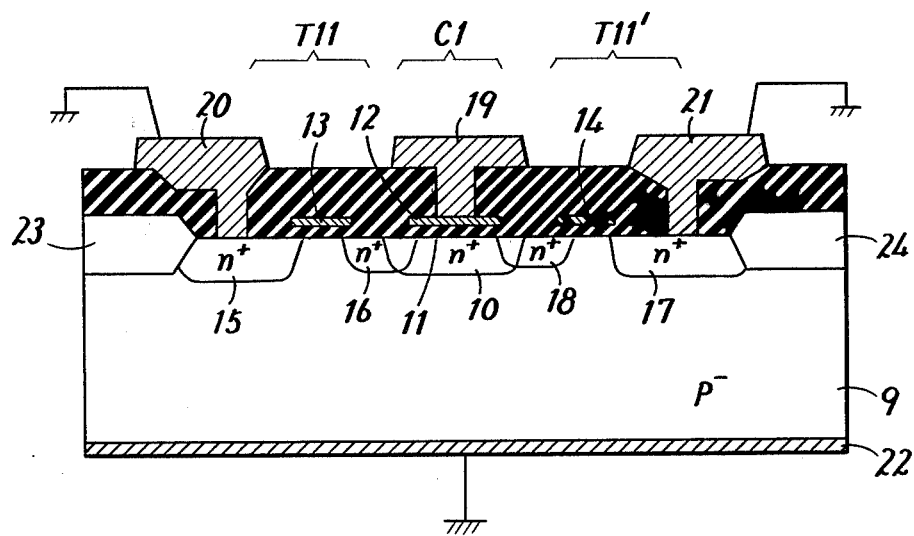
FIG. 6 is a sectional view showing the structure of an integrated circuit including a capacitance element and a switching transistor implementing the inventive variable capacitance device.

FIG. 6 shows a sectional view of only a portion of an integrated circuit for implementing the FIG. 4 variable capacitance device including one capacitance element and two switching transistors associated therewith, the remaining portions of the integrated circuit being omitted for simplicity of illustration. Referring to FIG. 6, a capacitance element C1 and two switching transistors T11 and T11' are formed on a semiconductor substrate 9 of a given conductivity type, such as a P type silicon substrate, which is simply referred to as "a P type silicon substrate" hereinafter. The resistivity of the P type semiconductor substrate 9 may be 20 through 50Ω cm. The capacitance element C1 may comprise a region 10 of an opposite conductivity type, such as an N region, formed on one surface of the above described P type semiconductor substrate 9, an insulating layer 11 deposited on the above described N type region 10, and an electrode 12 formed isolated from the above described N type region 10 with the insulating layer 11 therebetween for being supplied with a predetermined direct current voltage Vc. At both sides of the capacitance device C1 thus formed, the above described two insulated gate type field effect transistors T11 and T11' both constituting the field effect transistor T1 of the FIGS. 3 and 4 variable capacitance devices are formed so as to share the above described P type semiconductor substrate 9. Gate electrodes 13 and 14 for the above described transistors T11 and T11' are made of polycrystalline silicon or a refractory metal or a heat-resisting metal such as molibden, tungsten, chromium, tantaron, titanium, or the like. Source electrodes 15 and 17, and drain electrodes 16 and 18 of the above described transistors T11 and T11' each may be a highly doped N type region formed on the P type semiconductor substrate 9, as is similar to one electrode 10 of the capacitance element C1. A conductor 19 for application of a predetermined direct current voltage to the other electrode 12 of the capacitance element C1 is formed through evaporation of aluminum. Similarly, conductors 20 and 21 connecting the source regions 15 and 17 of the transistors T11 and T11', respectively, to the ground are formed of an aluminum material. A gold alloyed layer 22 is formed on the other surface of the P type semiconductor substrate 9 for the purpose of grounding.

Now referring to FIGS. 7 through 10, the steps of manufacturing the inventive variable capacitance device of an integrated circuit structure as shown in FIG. 6 will be described in the following.

Figure 7:
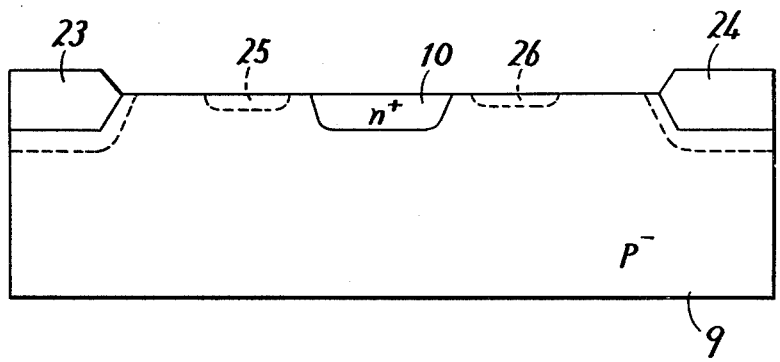

(1) At the outset, referring to FIG. 7, an impurity of boron is ion implanted into the P type semiconductor substrate of an extremely high negative ion concentration such that the impurity of boron is entered in the substrate to the depth of $0.3\mu$ and highly doped P type regions 25 and 26 of an increased impurity concentration as compared with the substrate are formed to the depth of $0.3\mu$. Then phosphorus is diffused by means of phosphoric silicate glass to the central portion of the substrate such that a highly doped N type region 10 is formed to the depth of $1\mu$. The resistance per unit area of the N type region 10 is adapted to be 20Ω.

Then a highly doped P type region of an increased concentration as compared with that of the substrate is formed along the circumference of the above described P type semiconductor substrate 9 and silicon dioxide layers 23 and 24 are formed thereon. It is pointed out that there serves to prevent formation of a parasitic transistor.

Figure 8:
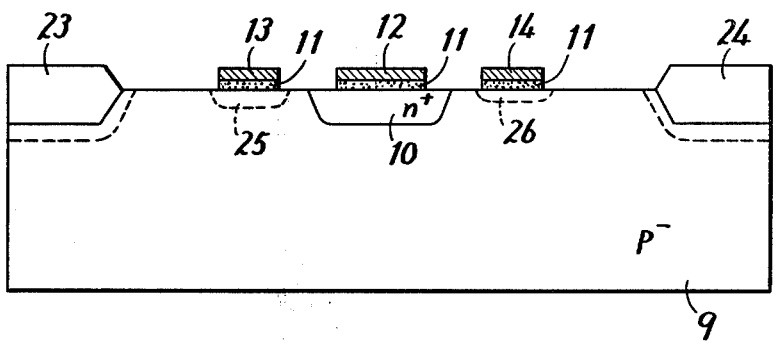

(2) Now referring to FIG. 8, insulating layers 11, 11, 11 of such as silicon dioxide are formed to a thickness of $0.1\mu$ on the above described regions 10, 25 and 26, and a capacitance element electrode 12 and gate electrodes 13 and 14 of such as a polycrystalline silicone material are formed on the respective insulating layers on the regions 10 and 25 and 26, respectively, to a thickness of $0.3\mu$.

Figure 9:
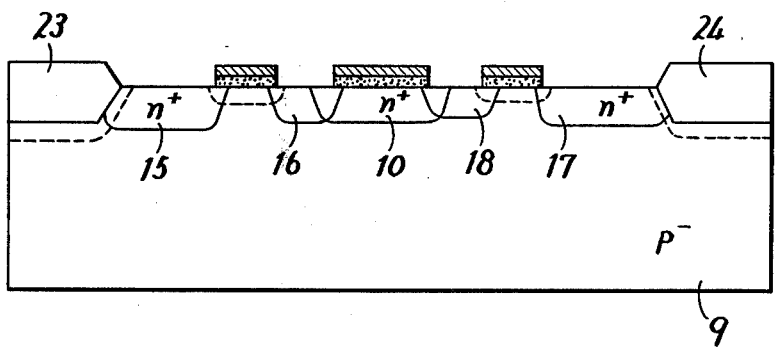

(3) Referring to FIG. 9, thereafter source regions 15 and 17 and drain regions 16 and 18 of the transistors are formed through selective diffusion of an impurity into the substrate. These source and drain regions are each a highly doped N type region and the process for forming the N type region 10 serving as one electrode of the capacitance element C1 may be employed for formation of the source and drain regions.

(4) Referring to FIG. 10, an insulating layer 11' of the same material as the above described insulating material 11 is formed on the whole surface of the substrate. Referring to FIG. 11, which shows a plan view of the inventive integrated circuit type variable capacitance device, aluminum layers 19, 20 and 21 are evaporated in the well known manner, while a gold alloyed layer is formed on the rear surface of the substrate 9, thereby to complete the inventive integrated circuit type variable capacitance device, as shown in FIG. 6.

As described previously, according to the embodiment shown, the length of the insulated gate type field effect transistor serving as a switching device can be increased by forming such switching devices at both sides of the capacitance element. As a result, the resistance Ron when the transistor is turned off is decreased, which enables utilization throughout a broader frequency range and accordingly makes it possible to provide a digital type tuning apparatus or channel selecting apparatus using an integrated circuit.

A second problem to be considered in implementing the inventive variable capacitance device in an integrated circuit structure is how to treat an undesired junction capacitance occuring between the N type region and the P type semiconductor substrate in the form of a parasitic capacitance. Such parasitic capacitance has been denoted as Cs1, Cs2, Cs3, ... Csn in the FIGS. 3 and 4. Referring to FIGS. 3 and 4, these parasitic capacitances are short circuited, when the transistors T1, T2, T3, ... Tn are conductive, whereby any adverse effect is avoided. Nevertheless, when these transistors are turned off, these parasitic capacitances could cause an adverse effect. More specifically, assuming that the capacitance element C1 is of a proper value and the capacitance values of the capacitance element C1 and the parasitic capacitance Cs1 are in the relation $C1 >> Cs1$, the composite capacitance C of the capacitance element C1 and the parasitic capacitance Cs1 when the transistor T1 is turned off may be expressed by the following equation:

$$C = (C1 \cdot Cs1/C1 + Cs1) = (Cs1/1 + Cs1/C1) \approx Cs1$$

It is seen from the above described equation that the parasitic capacitance Cs1 has a substantial influence upon the composite capacitance value C, as the case may be. Originally, the composite capacitance C of the capacitance element C1 and the parasitic capacitance Cs1 when the transistor T1 is turned off must be zero. Nevertheless, the parasitic capacitance would cause an influence upon the composite capacitance by a given capacitance value. In such a situation, such a composite capacitance is added to the total sum of the capacitances of the inventive variable capacitance device, inasmuch as the respective capacitance elements are coupled in parallel with each other and the capacitance value of the selected capacitance element is added to the total capacitance value of the inventive variable capacitance device. For this reason, the parasitic capacitance cannot be neglected, particularly when the inventive variable capacitance device is employed in a tuning apparatus or channel selecting apparatus. As a result, the variation range of the fixed capacitance of each of the capacitance elements C1, C2, C3, ... Cn cannot be selected to be larger, with the result that the variable capacitance device C is not suited for a tuning apparatus, without any consideration in this connection. The reason is that, when the transistor T2 is turned on while the remaining transistors are turned off, for example, then the parasitic capacitance Cs2 is shunted through conduction of the transistor T2 to render ineffective the parasitic capacitance Cs2 as a capacitance for a tuning circuit but nevertheless the parasitic capacitances Cs1 and Csn corresponding to the transistors T1 and Tn that are turned off have influence upon the total value of the capacitance of the inventive variable capacitance device by a given value, with the result that the effect of the capacitance element C2 in the capacitance device C as a whole is reduced by the value associated with the parasitic capacitance Cs1 and Csn.

For the above described reasons, the parasitic capacitances must be minimized as much as possible. To that end, according to the preferred embodiment of the present invention, a relatively large reverse bias is applied across the PN junction for the above described parasitic capacitances, whereby any adverse effect caused by the parasitic capacitances is minimized to be negligible. More specifically, the embodiment is structured such that a relatively large direct current voltage is applied to the opposite conductivity type region 10 constituting the capacitance element in the integrated circuit in the direction for decreasing the above described parasitic capacitances. It would be appreciated that since the above described parasitic capacitances are each of a PN junction capacitance an increased reverse bias applied thereacross considerably decreases such capacitance values. More specifically, referring to FIG. 4, the node between the capacitance element C1 and the parasitic capacitance Cs1 is coupled to a reverse bias voltage source E (+24 V) through a resistance constituting transistor r1'. The resistance constituting transistor r1' may be a resistor r1, as shown in FIG. 3. Although the above described reverse bias voltage is normally applied, the reverse bias voltage is ineffective when the switching transistor T1 is turned on and is effective to act on the opposite conductivity type region 10 through a resistor r1 or r1' only when the transistor T1 is turned off.

Incidentally described, capacitances between the gate and drain region of the respective transistors could also function as a parasitic capacitance, apart from the above described parasitic capacitances Cs1, Cs2, Cs3, ... Csn. However, the problem of parasitic capacitances between the gate and drain region of the respective transistors can be solved by adopting a transistor structure of self alignment with respect to a gate, such as a polycrystalline silicon gate transistor. The above described embodiment provides the inventive variable capacitance device of an excellent characteristic suited for a digital channel selecting apparatus and implemented in an integrated circuit. In practicing the present invention, however, a consideration to be described subsequently can provide a more preferred channel selecting apparatus.

In general, with such a digital channel selecting apparatus as discussed with reference to FIGS. 2 thorugh 4, the tuning frequency can be only adjusted in a stepwise manner with a small frequency change $\Delta f$ for each small change $\Delta C$ of the capacitance attained by the variable capacitance device, which could leave a slight frequency deviation $\Delta f0$ with respect to a desired or normal frequency f0, even when a tuning state is established. No problem would occur within the range where such frequency deviation or drift is allowed. Thus, the minimum required capacitance change $\Delta C0min$ of the above described variable capacitance device is determined with respect to the maximum allowable frequency deviation or drift $\Delta f0max$ which is determinable from the stand point of the tuning circuit operation. It is pointed out that the above described minimum required capacitance change $\Delta C0min$ indicates a width with which the capacitance of the variable tuning capacitance device is varied in a stepwise manner or in a digital manner. Accordingly, the minimum unit of the respective capacitance of a plurality of tuning capacitance elements coupled in parallel with each other of the variable capacitance device must be smaller than at least the above described minimum required capacitance change $\Delta C0min$. The reason is that the capacitance of each of a plurality of tuning capacitance elements coupled in parallel with each other of the variable capacitance device is determined as a total sum of the capacitance value of each elements. Thus, the broader the frequency region to be covered by the tuning circuit, the smaller the minimum required capacitance change $\Delta C0min$ for the above described maximum allowable frequency deviation $\Delta f0max$. The reason is that since the parallel resonant frequency f is generally determined by the equation $f = 1/2\pi\sqrt{LC}$, assuming that resistance of a coil is neglected, the higher the frequency region of the resonance frequency f of the tuning circuit, the smaller the capacitance of the variable capacitance device and accordingly the smaller the required capacitance change $\Delta C0$ for the allowable frequency deviation $\Delta f0$ in such a higher frequency region of the resonance frequency f. Thus, the required capacitance change for the allowable frequency deviation in the maximum frequency of such a higher region becomes the minimum required capacitance change $\Delta C0min$.

Since the minimum unit of the respective capacitance of a plurality of tuning capacitance elements coupled in parallel with each other of the variable capacitance device must be smaller than at least the minimum required capacitance change ΔC0min, as thus described, the broader the frequency region to be covered by the tuning circuit, the smaller the minimum required capacitance change ΔC0min, with the result that the respective capacitance elements constituting the variable capacitance device would be of an extremely small capacitance value.

Assuming that such a value is ΔC0 and the capacitance values of the respective N capacitance elements are selected in the following relation, $$C1 = \Delta C0$$
$$C2 = 2\Delta C0$$
$$C3 = 4\Delta C0$$
$$C4 = 8\Delta C0$$
$$\vdots$$
$$Cn = 2^{n-1}\Delta C0$$

then the total sum of the capacitances of the capacitance elements can be varied at the interval of ΔC0 from ΔC0 up to $(1+2+4+\ldots+2^{n-})\Delta C0$. Some examples of a combination of such capacitance elements for achieving gradually variable total capacitance value at the interval of ΔC are shown in the following, wherein the left column denotes the capacitance value to be achieved while the right column in the parenthesis denotes a combination of the capacitance elements for achieving such a total capacitance value.

ΔC0 [C1]
2ΔC0 [C2]
3ΔC0 [C1 + C2]
4ΔC0 [C3]
5ΔC0 [C1 + C3]
6ΔC0 [C2 + C3]
7ΔC0 [C1 + C2 + C3]
8ΔC0 [C4]
9ΔC0 [C1 + C4]
10ΔC0 [C2 + C4]
11ΔC0 [C1 + C2 + C4]
·
·

As seen from the foregoing description, when the capacitance values of the capacitance elements, C1, C2, C3, ... Cn are selected to have a predetermined ratio relation in order, then a fine variation of the capacitance value by way of a variable capacitance device can be achieved in a digital manner. Nevertheless, implementation of such a variable capacitance device in an integrated circuit structure makes it difficult to enhance precision in such a digital relation of the capacitance elements.

In general, a capacitance C of a capacitance element in the inventive variable capacitance device can be expressed by the following equation:

$$C = \epsilon\epsilon_0 lW/d$$

where ε is a dielectric constant of the insulating layer, ε0 is the dielectric constant of a vacuum, l is the length of the capacitance element in FIG. 5, W is the width of the capacitance element in FIG. 5, and d is the thickness of the gate insulating layer between the gate and the channel region. From the above described equation, therefore, it is seen that if it is desired that the capacitance value C is doubled, theoretically such an increase of the capacitance value C could be achieved by properly varying the values of the dielectric constant ε, the length l, the width W and/or the thickness d. In actuality, however, a change of the dielectric constant ε means substitution of a different semiconductor material and is not preferred. It is also difficult to change the value of the thickness d. Most typically, therefore, those skilled in the art would conceive the change of the width W, in order to change the capacitance value C. Nevertheless, such an approach is neither preferred in practicing the present invention, unless another process with accuracy is employed, as different from a photolithographic process that could cause an error ΔW with respect to the width, as to be described subsequently. As is readily understood by those skilled in the art, a photolithographic process to be effected prior to an etching process for achieving the FIG. 5 arrangement could necessarily cause an error ΔW with respect to the width W of the capacitance element and such errors of substantially the same value occur in the respective capacitance elements C1, C2, C3, ... Cn. In general, an error of as large as 1μ could be inevitably caused in a photolithographic process. In such situation, the length error Δl is negligible with respect to the length l, while the width error ΔW becomes rather dominant with respect to the width W, as seen from the FIG. 5 illustration. Therefore, any influence caused by the length error Δl upon the total capacitance value is negligible, whiel the width error ΔW causes some influences upon the total capacitance value. Therefore, the capacitance values C1 and C2 of the respective capacitance elements C1 and C2 may be expressed by the following equations:

$$C1 = \epsilon\epsilon_0 l(W+\Delta W)/d,$$

$$C2 = \epsilon\epsilon_0 l(2W+\Delta W)/d.$$

Therefore, the ratio C2/C1 may be expressed by the following equation:

$$C2/C1 = 2W + \Delta W/W + \Delta W$$

Similarly, the ratio C3/C2 may be expressed by the following equation:

$$C3/C2 = 4W + \Delta W/2W + \Delta W$$

As seen from the foregoing equations, the ratio Cn/Cn-1 is not constant. Thus, it is seen that the above described requirement is not satisfied. It has been observed, however, that the above described problem can be solved by changing the length l of the capacitance element, while the width W of the capacitance element is maintained constant. More specifically, assuming that the length l of the capacitance element is changed at a given rate, then the capacitance values C1 and C2 of the capacitance elements C1 and C2 may be expressed by the following equations:

$$C1 = \epsilon\epsilon_0(W+\Delta W)l/d,$$

$$C2 = \epsilon\epsilon_9(W+\Delta W)X2l/d,$$

Therefore, the ratio C2/C1 may be expressed as follows.

$$C2/C1 = 2,$$

Similarly, the ratio C3/C2 and thus the ratio Cn/Cn-1 may be expressed as follows:

$C3/C2=2, Cn/Cn-1=2$

From the foregoing description, it would be appreciated that the previously described requirement is satisfied.

It would be further appreciated that any adverse influence caused by undesired junction capacitances Cs1, Cs2, Cs3, ... Csn occurring between the N type region 10 and the P type semiconductor substrate 9 can be eliminated by varying the length l of the capacitance elements at a given rate. Referring to FIG. 4, for example, a parasitic capacitance Cs1 becomes effective when the transistor T1 is turned off, and the composite capacitance of the capacitance element C1 and the parasitic capacitance Cs1 may be C1·Cs1/C1+C2. Therefore, a capacitance change ΔC1 when the transistor is changed from the cut off state to the conduction state may be expressed by the following equation:

$$\Delta C1 - C1 \cdot Cs1/C1 + Cs1 = C1^2/C1 + Cs1/ = C0/C0 + Cs \cdot \Delta C0$$

Similarly, the capacitance change ΔC2 when the transistor T2 is changed from the cut off state to the conduction state may be expressed by the following equation:

$$\Delta C2 = C2/C2 + Cs2 \cdot 2\Delta C0$$

The same applies to the capacitance change ΔCn, which may be expressed by the following equation:

$$\Delta Cn = Cn/Cn + Csn \cdot 2^{n-1} \Delta C0$$

The above described equations show that the capacitance value cannot be changed at the interval of the minimum limit ΔC0. However, assuming that a given constant rate is allotted to the relation of the parasitic capacitances to the capacitance values of the respective capacitance elements C1, C2, C3, ... Cn, i.e. $Csn = \alpha Cn$, such as $Cn/Cn-1=2$ in the example described above, then $C2=2C1$ and the relation $Cs2=2Cs1$ is attained from the structure and thus the relation $Cs2/C2 = 2Cs1/2C1 = Cs1/C1 = \alpha$ is obtained, assuming $Cs1/C1 = \alpha$, and the relation $Csn = \alpha Cn$ is satisfied, and thus the following equations are obtained:

$$\Delta C1 = \frac{1}{1+\alpha} \cdot \Delta C0$$
$$\Delta C2 = 2 \cdot \frac{1}{1+\alpha} \cdot \Delta C0$$
$$\vdots$$
$$\Delta Cn = 2^{n-1} \frac{1}{1+\alpha} \cdot \Delta C0$$

The above described equations indicate that a combination of the capacitances of the capacitance elements can achieve a variation of all the capacitance values from $1/1+\alpha \cdot C0$ to $(1+2+2^2+...+2^{n-1}) 1/1+\alpha \cdot C0$ at the interval of $1/1+\alpha \cdot \Delta C0$ starting from the minimum capacitance value, while the minimum unit merely changes from ΔC0 to $1/1+\alpha \cdot \Delta C0$, with the result that an undesired influence caused by the parasitic capacitance can be eliminated.

It has been observed that as far as the parasitic capacitances are concerned, not only the junction capacitances occurring between the N type region and the P type semiconductor substrate 9 but also the capacitances between the gates 13 and 14 and the drains 16 and 18 of the transistor cannot be neglected. Although the capacitances between the gates 13 and 14 and the substrate 9 are relatively large and cause very little influence, the capacitance between the gate and drain is relatively small and have large influence upon the total capacitance value of the inventive variable capacitance device. However, any adverse influence cause by parasitic capacitances between the gates and drains can also be eliminated by varying the length of the transistors T1, T2, ... Tn at a given rate, as done in conjunction with the capacitance elements. More specifically, assuming that the minimum length of the drain electrode and the gate electrode of the transistor is l, the length of the remaining transistors is selected to be l, 2l, 4l, ..., $2^{n-1}l$.

Accordingly, FIG. 11 shows a pattern of an integrated circuit of a preferred embodiment of the present invention. In order to satisfy the above described requirement, the capacitance element C2 is selected to be as long as two times the capacitance element C1 and the capacitance element C3 is selected to be as long as two times the capacitance element C2, and so on. Although only three capacitance elements C1, C2, and C3 are shown in FIG. 11, it is to be understood that a predetermined number of capacitance elements the lengths of which are varied at the same rate in succession are formed at the right side as viewed in the figure in order. Thus, the capacitance values of the capacitance elements are weighted in order. In other words, the capacitance values of the capacitance elements are varied to achieve digital coding. Referring to FIG. 11, hatched portions 13 and 14; 13' and 14'; and 13" and 14" denote gate electrode of a pair of switching transistors formed at both sides of the respective first, second, and third capacitance elements C1, C2 and C3, respectively, so as to extend in proportion to the lengths of the corresponding capacitance elements C1, C2 and C3, respectively. These gates are coupled through runs 27 and 28; 27' and 28'; and 27" and 28" to input terminals A1, A2 and A3, respectively, for receiving a switching control signal of a bit parallel coded format. Dot hatched portions 19, 19' and 19" denote aluminum conductors for the capacitance elements C1, C2, and C3, respectively. These conductors are coupled to each other through the respective runs 29, 29' and 29", respectively, and coupled to a supply path 30 of a predetermined direct current voltage Vc. The remaining dot hatched portions 20, 21, 21' and 21" denotes aluminum conductors leading to source electrodes of the respective transistors. These aluminum conductors are coupled commonly to a ground potential line 31. The source electrodes of any adjacent transistors, i.e. the source electrodes of the transistor at the right side of the capacitance element C1 and the transistor at the left side of the capacitance element C2, the source electrodes of the transistor at the right side of the capacitance element C2 and the transistor at the left side of the capacitance element, and so on are shared with each other for simplicity of structure, and thus the above described aluminum conductors 21 and 21' of the adjacent transistors are also common to each other.

As seen from FIG. 6, the drain regions of the transistors T11 and T11' and one electrode of the capacitance element C1 are formed with the N type regions 16, 18 and 10 are contiguous to each other. Therefore, an electrical connection to them is achieved by a single run 32. The run 32 may be an extension of the N type region for the drain of the transistor T11 provided on the P type semiconductor substrate 9, for example. Wherein another transistor r1' constituting resistance may be formed midway in a well known manner. The drain region of the transistor r1' for constituting the above described resistance and the supply path 33 of a relatively high direct current voltage E are coupled to each other with an aluminum conductor 34. Similarly, an aluminum conductor 35 is provided to connect the gate electrode of the transistor r1' for constituting the resistance to the above described supply path 33 through a run 36. A similar structure is employed with each of the capacitance elements C2 and C3, as seen from the illustration.

It was previously described that according to one feature of the present invention a relatively large direct current voltage is applied between the opposite conductivity type region (the N type region in the embodiment shown) constituting the capacitance element and the semiconductor substrate in the direction for decreasing the junction capacitance occurring therebetween. The above described voltage is adapted to be normally applied to the N type region constituting one electrode of the respective capacitance elements C1, C2 and C3 through the transistors r1', r2' and r3' constituting the resistances and the runs 32, 32' and 32" from the supply path 32", the voltage value E being about 24 V.

Although in the foregoing the embodiment was described wherein the switching transistors were formed at opposite sides of each of the capacitance elements C1, C2, C3, . . . Cn, it is to be pointed out that it is not necessarily required that these transistors are provided at both sides of all the capacitance elements. In a certain modification, such transistors may be provided at only one side of certain capacitance elements.

Figure 12:
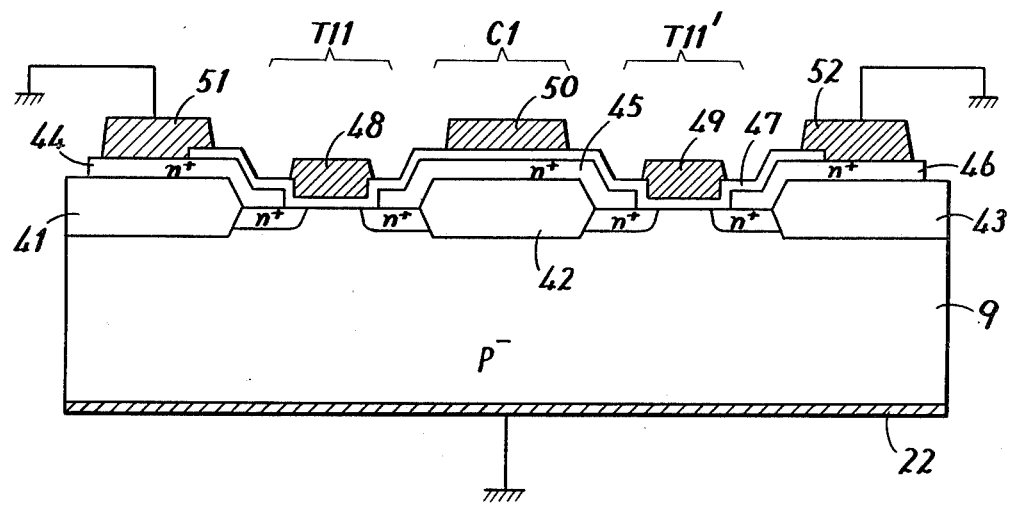
FIG. 12 shows a sectional view of another preferred embodiment of the inventive integrated circuit variable capacitance device.

FIG. 12 shows a sectional view of another preferred embodiment of the inventive integrated circuit variable capacitance device. According to the embodiment shown, a P type semiconductor substrate 9 such as a silicon substrate having an extremely high negative ion concentration is provided with oxide films 41, 42 and 43 for preventing occurrence of parasitic transistors. Then polycrystalline silicon regions doped with phosphorus are formed on the substrate. The phosphorus to be defused from the doped silicon into the silicon substrate serves to form an N+ region in the silicon substrate. Then an insulating layer 47 of a thickness of $0.1\mu$ is formed on the surface of the exposed silicon substrate 9 and the surface of the doped silicon. Aluminum is then vapored on the silicon substrate, whereby electrodes 48 and 49 are formed and thus insulated gate field effect transistors T11 and T11' are fabricated. At the same time, an electrode 50 is formed, to form a capacitor C1. Electrodes 51 and 52 are formed as electrodes for the source regions of the insulated gate field effect transistors T11 and T11'.

Figure 13:
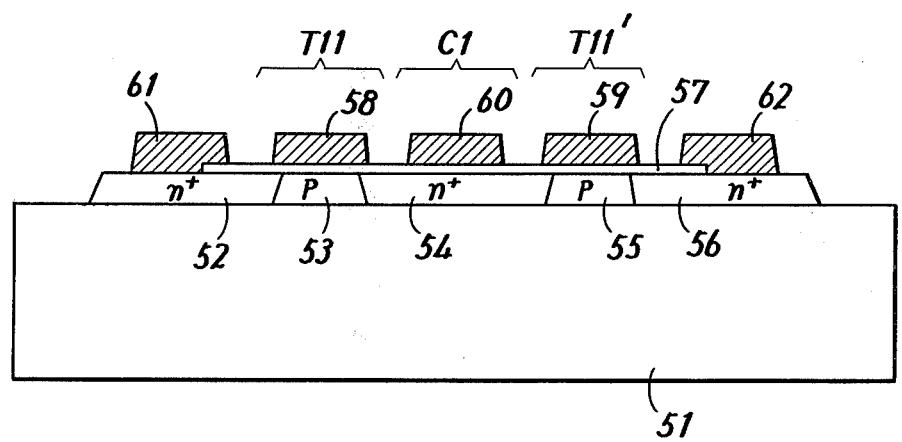
FIG. 13 shows a sectional view of a further preferred embodiment of the inventive integrated circuit variable capacitance device.

FIG. 13 shows a sectional view of a further preferred embodiment of the inventive integrated circuit variable capacitance device. The FIG. 13 embodiment is implemented using a silicon on sapphire composite. More specifically, P type silicon regions 52 thorough 56 of a resistivity of $1\Omega$ cm are grown to a thickness of $0.4\mu$ in an epitaxial manner on a monocrystalline sapphire substrate. Then N+ regions 52, 54, 56 are formed through diffusion of phosphorus into the silicon regions. An insulating film 56 of a thickness of $0.1\mu$ is formed on the silicon layers. Thereafter, aluminum is evaporated thereon to form gate electrodes 58 and 59 of insulated gate field effect transistors T11 and T11' and simultaneously to form an electrode 60 to constitute a capacitance element C1. Electrodes 61 and 62 are formed as electrodes for the source regions of the insulated gate field effect transistors T11 and T11'.

As seen from the foregoing description, according to the embodiments depicted in the foregoing a tuning apparatus or a channel selecting apparatus of an integrated circuit structure is provided wherein a plurality of capacitance elements each having a fixed capacitance value are coupled in parallel with each other such that the capacitance elements are selectively rendered effective responsive to a digital control signal to change a combination of capacitance elements and to achieve a variable capacitance device. Since a number of capacitance elements each having a fixed capacitance value can be provided according to the embodiment described in the foregoing, a channel selecting apparatus of enhanced precision can be provided.

Although in the above described embodiments the inventive variable capacitance device was described as embodied in the digital channel selecting apparatus, it should not be construed that the inventive variable capacitance device is only applicable to a digital channel selecting apparatus. For example, the inventive variable capacitance device may also be employed in an LC oscillator, an RC oscillator, a receiver, a frequency fine adjusting circuit for a crystal oscillator, a digital-/analog converter for converting a digital capacitance variation into a digital voltage variation and further convert the digital voltage variation into a corresponding analog voltage variation.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:
1. A variable capacitance device comprising:
   a plurality of capacitance elements, each having a predetermined capacitance value and coupled in parallel with each other wherein said plurality of capacitance elements are formed on a single common substrate, each said capacitance element comprising a conductive region formed on one surface of said single common substrate, an insulating layer formed on said conductive region, and an electrode formed on said conductive region with said insulating layer therebetween;
   a plurality of switching means, each individually coupled to said plurality of capacitance elements for individually and selectively rendering effective said plurality of capacitance elements wherein each said switching means is an insulated gate field effect transistor having a gate, drain and source;
   at least some of said insulated gate field effect transistors being divided into at least two portions, said at least two insulated gate field effect transistor portions being formed with respect to at least one said capacitance element such that a predetermined portion of said single common substrate is shared by said at least two insulated gate field effect transistor portions and at least one capacitance element, wherein said conductive region of said capacitance element and drain of said insulated gate field effect transistor are electrically connected; and the gate portions of said at least two insulated gate field effect transistor portions and said at least one said capacitance element are coupled to each other whereby, when conducting, said at least two insulated gate field effect transistor portions form a single, low resistance switching device for said capacitance element.

2. A variable capacitance device in accordance with claim 1, wherein said at least two insulated gate field effect transistor portions have substantially the same electrical characteristic.

3. A variable capacitance device in accordance with claim 1, wherein a variable capacitance range of said variable capacitance device comprises at least a relatively higher and lower capacitance value regions.

4. A variable capacitance device in accordance with claim 1, wherein said single common substrate comprises a semiconductor substrate of one conductivity type, and said conductive region comprises an opposite conductivity type region.

5. A variable capacitance device in accordance with claim 1, wherein said single common substrate comprises a monocrystalline sapphire substrate, and
said conductive region comprises a silicon monocrystalline layer grown in an epitaxial manner on the surface of said monocrystalline sapphire substrate.

6. A variable capacitance device in accordance with claim 1, wherein said at least two insulated gate field effect transistor portions and said at least one said capacitance device are formed at both sides of said capacitance element.

7. A variable capacitance device in accordance with claim 1, which further comprises means for applying a direct current voltage to said conductive region in the direction for decreasing a junction capacitance occurring between said conductive region and said substrate when said insulated gate field effect transistor is turned off.

8. A variable capacitance device in accordance with claim 3, which further comprises means for applying a direct current voltage to said conductive region in the direction for decreasing a junction capacitance occurring between said conductive region and said substrate when said insulated gate field effect transistor is turned off.

9. A variable capacitance device in accordance with claim 1, wherein the capacitance values of said plurality of capacitance elements are weighted in a predetermined relation.

10. A variable capacitance device in accordance with claim 9, wherein the area of the overlapping portion of said conductive region and said electrode in the length direction varies in a predetermined relation with respect to each said capacitance element whereby the capacitance value of said capacitance elements is weighted in a predetermined relation.

11. A variable capacitance device in accordance with claim 10, wherein the length of said transistor portions provided for each said capacitance element is varied in proportion to said length of the corresponding capacitance element.

12. A variable capacitance device in accordance with claim 9, wherein said weighting of capacitance values of said plurality of capacitance elements is selected to be in a predetermined digital coded pattern.

13. A variable capacitance device in accordance with claim 1, which further comprises
a first comb shaped metallic layer for coupling in parallel the respective electrodes of said plurality of capacitance elements for providing a first terminal of said variable capacitance device, and
a second comb shaped metallic layer interdigitated with said first comb shaped metallic layer and coupled to the respective sources of said insulated gate field effect transistors for providing a second terminal of said variable capacitance device.

14. A variable capacitance device in accordance with claim 3, which further comprises
a first comb shaped metallic layer for coupling in parallel the respective electrodes of said plurality of capacitance elements for providing a first terminal of said variable capacitance device, and
a second comb shaped metallic layer interdigitated with said first comb shaped metallic layer and coupled to the respective sources of said insulated gate field effect transistors for providing a second terminal of said variable capacitance device.

15. A variable capacitance device in accordance with claim 7, which further comprises
a first comb shaped metallic layer for coupling in parallel the respective electrodes of said plurality of capacitance elements for providing a first terminal of said variable capacitance device, and
a second comb shaped metallic layer interdigitated with said first comb shaped metallic layer and coupled to the respective sources of said insulated gate field effect transistors for providing a second terminal of said variable capacitance device.

16. A variable capacitance device in accordance with claim 1, wherein the length of each said capacitance element formed on said single common substrate is substantially the same as the length of each said transistor associated with said capacitance element.

17. A digital channel selecting apparatus for selecting a channel among a plurality of channels which are distributed in at least a relatively higher and lower frequency regions comprising:
tuning circuit means including a variable capacitance component, said variable capacitance component including a plurality of capacitance elements coupled in parallel with each other, wherein said plurality of said capacitance elements are formed on a single common substrate, each said capacitance element comprising a conductive region formed on one surface of said single common substrate, an insulating layer formed on said conductive region, and an electrode formed on said conductive region with said insulating layer therebetween;
a plurality of switching means individually coupled to said plurality of capacitance elements for individually and selectively rendering effective said plurality of capacitance elements wherein each said switching means is an insulated gate field effect transistor having a gate, drain and source;
at least some of said insulated gate field effect transistors being divided into at least two portions, said at least two insulated gate field effect transistor portions being formed with respect to at least one said capacitance element such that a predetermined portion of said single common substrate is shared by said at least two insulated gate field effect transistor portions and said at least one capacitance element; and selection circuit means for generating a coded digital control switch for selectively enabling said plurality of switching means for achieving a tuning state by said tuning circuit means through selectively rendering effective said plurality of capacitance elements corresponding to a channel being selected wherein said conductive region constituting said capacitance element and drain of said insulated gate field effect transistor are electrically connected; and the gate portions of said at least two insulated gate field effect transistor portions and said at least one said capacitance means are coupled to each other whereby, when conducting, said at least two insulated gate field effect transistor portions form a single, low resistance switching device for said capacitance element.

18. A variable capacitance device in accordance with claim 17, wherein said at least two insulated gate field effect transistor portions have substantially the same electrical characteristic.

19. A variable capacitance device in accordance with claim 17, wherein a variable capacitance range of said variable capacitance device comprises at least a relatively higher and lower capacitance value regions.

20. A variable capacitance device in accordance with claim 17, wherein said single common substrate comprises a semiconductor substrate of one conductivity type, and said conductive region comprises an opposite conductivity type region.

21. A variable capacitane device in accordance with claim 17, wherein said single common substrate comprises a monocrystalline sapphire substrate, and
said conductive region comprises a silicon monocrystalline layer grown in an epitaxial manner on the surface of said monocrystalline sapphire substrate.

22. A variable capacitance device in accordance with claim 17, wherein said at least two insulated gate field effect transistor portion and said at least one said capacitance device are formed at both sides of said capacitance element.

23. A variable capacitance device in accordance with claim 17, which further comprises means for applying a direct current voltage to said conductive region in the direction for decreasing a junction capacitance occuring between said conductive region and said substrate when said insulated gate field effect transistor is turned off.

24. A variable capacitance device in accordance with claim 19, which further comprises means for applying a direct current voltage to said conductive region in the direction for decreasing a junction capacitance occurring between said conductive region and said substrate when said insulated gate field effect transistor is turned off.

25. A variable capacitance device in accordance with claim 17, wherein the capacitance values of said plurality of capacitance elements are weighted in a predetermined relation.

26. A variable capacitance device in accordance with claim 25, wherein the area of the overlapping portion of said conductive region and said electrode in the length direction varies in a predetermined relation with respect to each capacitance element whereby the capacitance value of said capacitance elements is weighted in a predetermined relation.

27. A variable capacitance device in accordance with claim 26, wherein the length of said transistor portions provided for each said capacitance element is varied in proportion to said length of the corresponding capacitance element.

28. A variable capacitance device in accordance with claim 25, wherein said weighting of capacitance values of said plurality of capacitance elements is selected to be in a predetermined digital coded pattern.

29. A variable capacitance device in accordance with claim 17, which further comprises
a first comb shaped metallic layer for coupling in parallel the respective electrodes of said plurality of capacitance elements for providing a first terminal of said variable capacitance device, and
a second comb shaped metallic layer interdigitated with said first comb shaped metallic layer and coupled to the respective sources of said insulated gate field effect transistors for providing a second terminal of said variable capacitance device.

30. A variable capacitance device in accordance with claim 19, which further comprises
a first comb shaped metallic layer for coupling in parallel the respective electrodes of said plurality of capacitance elements for providing a first terminal of said variable capacitance device, and
a second comb shaped metallic layer interdigitated with said first comb shaped metallic layer and coupled to the respective sources of said insulated gate field effect transistors for providing a second terminal of said variable capacitance device.

31. A variable capacitance device in accordance with claim 23, which further comprises
a first comb shaped metallic layer for coupling in parallel the respective electrodes of said plurality of capacitance elements for providing a first terminal of said variable capacitance device, and
a second comb shaped metallic layer interdigitated with said first comb shaped metallic layer and coupled to the respective sources of said insulated gate field effect transistors for providing a second terminal of said variable capacitance device.

32. A variable capacitance device in accordance with claim 17, wherein the length of each said capacitance element formed on said single common substrate is substantially the same as the length of each said transistor associated with said capacitance element.

33. A variable capacitance device comprising:
a plurality of capacitance elements, each having a predetermined capacitance value and coupled in parallel with each other wherein said plurality of capacitance elements are formed on a single common substrate, each said capacitance element comprising a conductive region formed on one surface of said single common substrate, an insulating layer formed on said conductive region, and an electrode formed on said conductive region with said insulating layer therebetween; and
a plurality of switching means, each individually coupled to said plurality of capacitance elements for individually and selectively rendering effective said plurality of capacitance elements wherein each said switching means is an insulated gate field effect transistor having a gate, drain and source, wherein said conductive region of said capacitance element and drain of said insulated gate field effect transistor are electrically connected.

34. A variable capacitance device in accordance with claim 33 wherein said at least two insulated gate field effect transistor portions have substantially the same electrical characteristic.

35. A variable capacitance device in accordance with claim 33 wherein a variable capacitance range of said variable capacitance device comprises at least a relatively higher and lower capacitance value regions.

* * * * *